United States Patent
Yamada et al.

(10) Patent No.: US 7,320,164 B2
(45) Date of Patent: Jan. 22, 2008

(54) METHOD OF MANUFACTURING AN ELECTRONIC COMPONENT

(75) Inventors: Hajime Yamada, Otsu (JP); Masaki Takeuchi, Otsu (JP); Hideki Kawamura, Shiga-ken (JP); Yukio Yoshino, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 497 days.

(21) Appl. No.: 11/097,888

(22) Filed: Mar. 31, 2005

(65) Prior Publication Data

US 2005/0168105 A1 Aug. 4, 2005

Related U.S. Application Data

(62) Division of application No. 10/338,707, filed on Jan. 9, 2003, now abandoned.

(30) Foreign Application Priority Data

Jan. 10, 2002 (JP) ............... 2002-003304
Nov. 11, 2002 (JP) ............... 2002-327253

(51) Int. Cl.
*H01L 41/047* (2006.01)
(52) U.S. Cl. ............... 29/25.35; 29/847; 310/312; 310/365
(58) Field of Classification Search ............... 29/25.35, 29/594, 890.1, 847, 831, 846; 310/311, 312, 310/363, 365; 427/100; 216/13, 16
See application file for complete search history.

(56) References Cited

U.S. PATENT DOCUMENTS

| 4,037,176 A | 7/1977 | Ono et al. |
| 4,127,681 A | 11/1978 | Ferren et al. |
| 5,281,888 A * | 1/1994 | Takeuchi et al. ........ 310/365 X |

(Continued)

FOREIGN PATENT DOCUMENTS

JP 57-104833 6/1982

(Continued)

OTHER PUBLICATIONS

Park et al.; "Two-step Deposition Process of Piezoelectric ZnO Film and its Application for Film Bulk Acoustic Resonators" J. Vac. Sci. Technol., vol. 18, No. 5, Oct. 2000, pp. 2432-2436.

(Continued)

*Primary Examiner*—A. Dexter Tugbang
(74) *Attorney, Agent, or Firm*—Keating & Bennett, LLP (57) ABSTRACT

A manufacturing method for an electronic component includes a process of forming a lower electrode and a dummy electrode, which are electrically connected to each other, on a substrate, and a process of forming a piezoelectric thin film on the dummy electrode and the lower electrode while a predetermined bias potential is applied to the lower electrode via the dummy electrode. In this method, the piezoelectric thin film is formed on the lower electrode by stabilizing the potential of the lower electrode, thereby decreasing the surface roughness of the piezoelectric thin film. It is thus possible to manufacture an electronic component that exhibits excellent piezoelectric characteristics, in which the electromechanical coupling coefficient and the quality factor of a resonator are increased.

9 Claims, 13 Drawing Sheets

U.S. PATENT DOCUMENTS 5,622,748 A * 4/1997 Takeuchi et al. ....... 29/25.35 X

FOREIGN PATENT DOCUMENTS

| JP | 58-121817 | | 7/1983 |
|---|---|---|---|
| JP | 58-137317 | | 8/1983 |
| JP | 63-21297 | | 1/1988 |
| JP | 63-290258 | | 11/1988 |
| JP | 4-235041 | * | 8/1992 |
| JP | 08-148957 | | 6/1996 |
| JP | 2001-44520 | | 2/2001 |
| JP | 2001-168674 | | 6/2001 |
| JP | 2001-279438 | | 10/2001 |
| WO | WO 03/006701 A1 | | 1/2003 |

OTHER PUBLICATIONS

Smith; "Principles of Materials Science and Engineering"; McGraw-Hill Book Company; 1986; pp. 568-569.

* cited by examiner

METHOD OF MANUFACTURING AN ELECTRONIC COMPONENT

This application is a Divisional Application of U.S. patent application Ser. No. 10/338,707 filed Jan. 9, 2003 now abandoned.

BACKGROUND OF THE INVENTION

1. Field of the Invention

The present invention relates to an electronic component including a piezoelectric thin film, such as a piezoelectric thin-film resonator, and to a manufacturing method for such an electronic component. The present invention also relates to a filter, a duplexer, and an electronic communication apparatus including such an electronic component.

2. Description of the Related Art

The resonant frequency of a piezoelectric resonator utilizing a thickness-extensional-vibration mode of a piezoelectric substrate is inversely proportional to the thickness of the piezoelectric substrate, and therefore, the piezoelectric substrate must be processed to be very thin for use in the ultrahigh frequency range. In practice, however, in terms of decreasing the thickness of the piezoelectric substrate, a few hundred megahertz is the limit of high frequency in the fundamental mode due to limitations of the mechanical strength or the handling conditions, or other factors. In order to overcome this drawback, the following known piezoelectric thin-film resonator having better high-frequency characteristics has been proposed.

Figure 10:
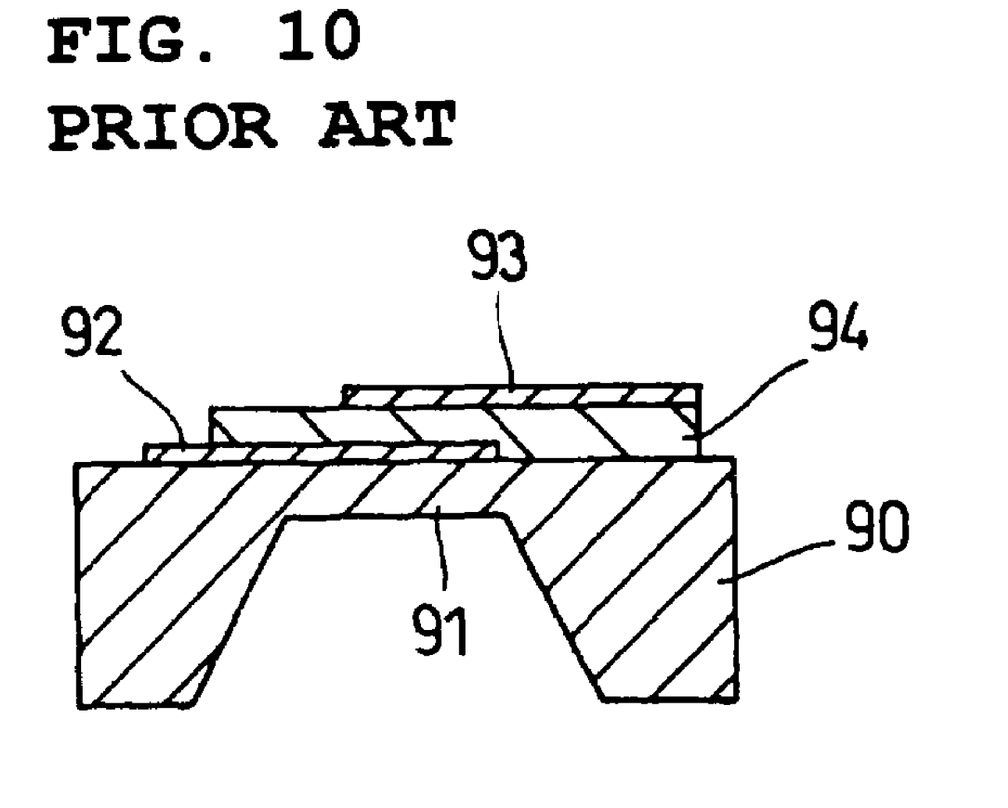
FIG. 10 is a side sectional view illustrating a known piezoelectric thin-film resonator.

In the piezoelectric thin-film resonator shown in FIG. 10, by partially etching a Si substrate 90 by a micro-processing technique, a thin-film support portion 91 having a thickness of a few microns or smaller is formed in a portion of the Si substrate 90, and a ZnO piezoelectric thin film 94 having a pair of excitation electrodes 92 and 93 is disposed on the thin-film support portion 91 (see, for example, Patent Document 1, Japanese Unexamined Patent Application Publication No. 2001-168674, page 3 and FIG. 3). In the piezoelectric thin-film resonator shown in FIG. 10, since the thickness of the thin-film support portion 91 can be decreased by using a micro-processing technique, and the thickness of the ZnO piezoelectric thin film 94 can also be decreased by, for example, sputtering, the frequency characteristics can be increased to a few hundred megahertz or a few thousand megahertz. In this resonator, however, the temperature characteristics of the resonant frequency are decreased because the temperature coefficients of the Young's modulus of both the ZnO piezoelectric thin film 94 and the Si substrate 90 are negative values.

Figure 11:
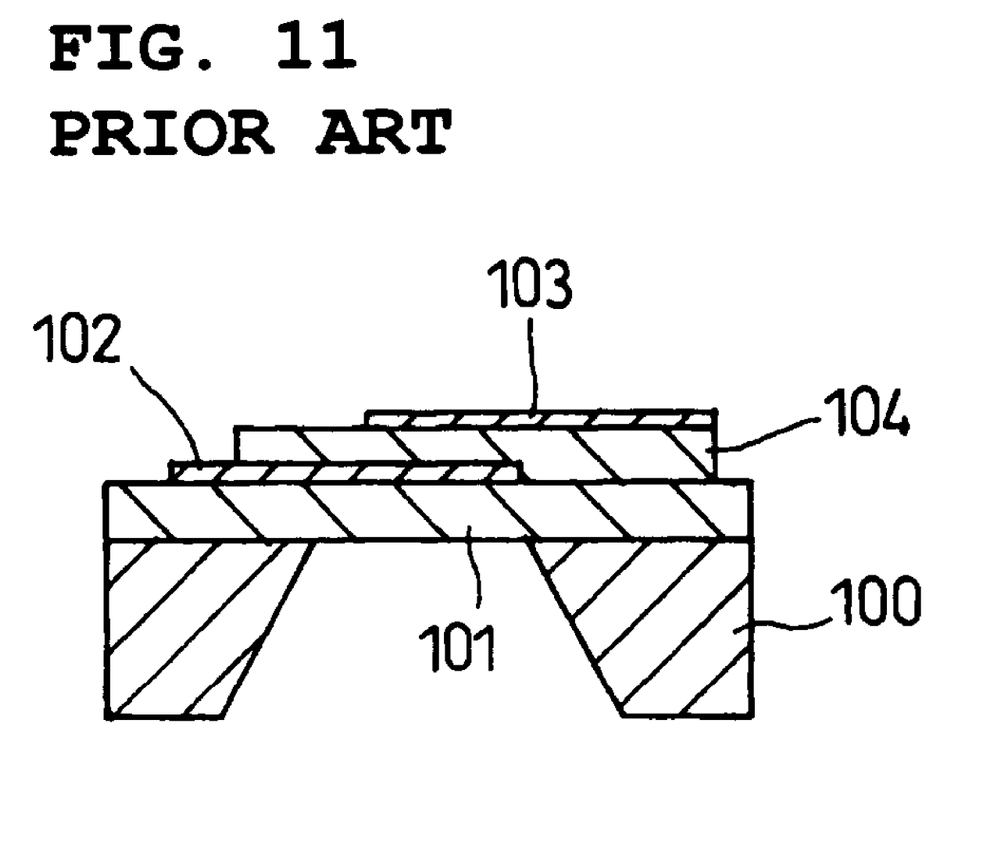
FIG. 11 is a side sectional view illustrating another known piezoelectric thin-film resonator.

To solve the problem of a decrease in the temperature characteristics of the resonant frequency, a piezoelectric thin-film resonator shown in FIG. 11 has been proposed. In this resonator, a $SiO_2$ thin film is formed on the surface of a Si substrate 100 by, for example, thermal oxidation, and a thin-film support portion 101 is formed by using the $SiO_2$ thin film by partially etching the Si substrate 100. A ZnO piezoelectric thin film 104 having excitation electrodes 102 and 103 on the upper and lower surfaces is disposed on the thin-film support portion 101. In the piezoelectric thin-film resonator shown in FIG. 11, the temperature coefficient of the Young's modulus of the thin-film support portion 101 is a positive value, unlike that of the ZnO piezoelectric thin film 104. Accordingly, by setting the ratio of the thickness of the ZnO piezoelectric thin film 104 to the thickness of the $SiO_2$ thin-film support portion 101 to a suitable value, the temperature characteristics of the resonant frequency can be made stable (see, for example, Patent Document 2, Japanese Unexamined Patent Application Publication No. 58-121817, all pages and all figures). However, in this resonator, the ZnO piezoelectric thin film 104 cannot be symmetrically located with respect to the vibration node of the fundamental thickness extensional vibration. Accordingly, not only the odd-order higher harmonics, such as third and fifth harmonics, but also even-order higher harmonics, disadvantageously generate spurious responses.

Figure 12:
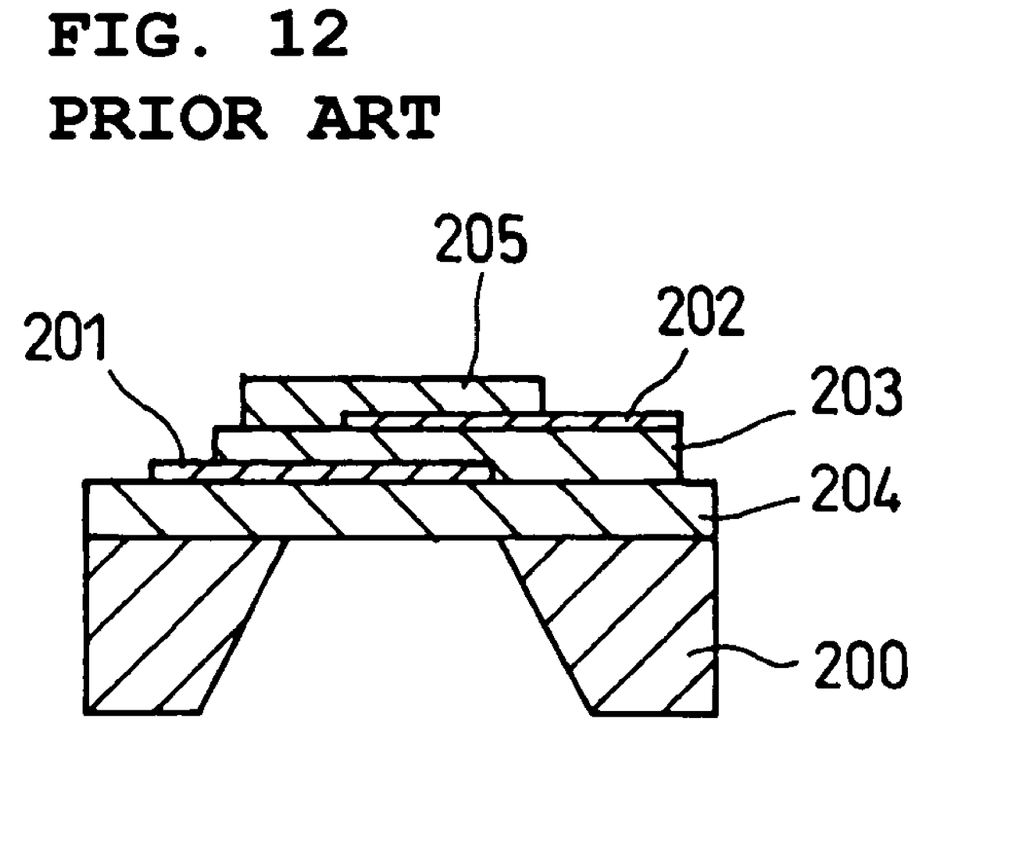
FIG. 12 is a side sectional view illustrating still another known piezoelectric thin-film resonator.

A piezoelectric thin-film resonator that can solve this problem is shown in FIG. 12. In this resonator, $SiO_2$ thin films 204 and 205 are symmetrically arranged on a substrate 200 with respect to a ZnO piezoelectric thin film 203 that is provided between electrodes 201 and 202. With this arrangement, the vibration node is positioned at the central portion of the ZnO piezoelectric thin film 203, thereby preventing the generation of spurious responses of even-order higher harmonics (see, for example, Patent Document 3, Japanese Unexamined Patent Application Publication No. 58-137317, all pages and all figures).

Figure 13:
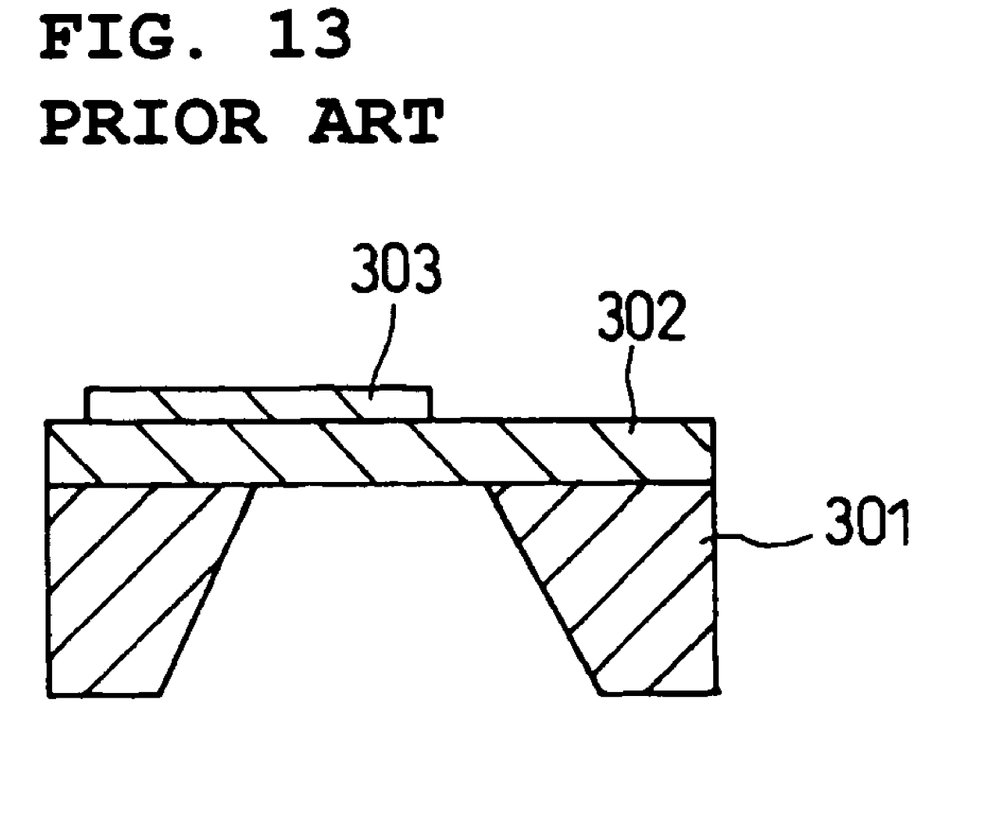
FIG. 13 is a side sectional view illustrating a further known piezoelectric thin-film resonator.

In any of the piezoelectric thin-film resonators shown in FIGS. 10 through 12, as shown in FIG. 13, a lower electrode 303 (which is equivalent to the lower electrodes 92, 102, and 201 in FIGS. 10, 11, and 12, respectively) is patterned on a thin-film support portion 302 (which is equivalent to the thin-film support portions 91, 101, and 204 in FIGS. 10, 11, and 12, respectively) formed on a Si substrate 301 (equivalent to the Si substrates 90, 100, and 200 in FIGS. 10, 11, and 12, respectively). On the patterned lower electrode 303, a ZnO piezoelectric thin film (which is equivalent to the piezoelectric thin films 94, 104, and 203 in FIGS. 10, 11, and 12, respectively) is formed. When forming a ZnO piezoelectric thin film by, for example, sputtering, the lower electrode 303 is isolated and becomes electrically floating, thereby having an unstable potential. Accordingly, the surface roughness (Ra) of the ZnO piezoelectric thin film formed on the lower electrode 303 having an unstable potential becomes greater than 10 nm, and the electromechanical coupling coefficient of a resonator produced by using this film becomes 1.5%, resulting in poor piezoelectric characteristics.

SUMMARY OF THE INVENTION

In order to solve the above-described problems, preferred embodiments of the present invention provide an electronic component, such as a piezoelectric thin-film resonator, including a piezoelectric thin film that exhibits excellent piezoelectric characteristics.

A method of manufacturing an electronic component according to a preferred embodiment of the present invention includes the steps of forming an electrode on a substrate, and forming a piezoelectric thin film on the electrode while a predetermined bias potential is applied to the electrode. According to a preferred embodiment of the present invention, the electrode can be stabilized without becoming electrically floating during the formation of the piezoelectric thin film. Thus, the surface roughness of the piezoelectric thin film formed on the electrode having a stable potential is greatly decreased, and the gradient of the C axis of the ZnO piezoelectric thin film with respect to the normal of the substrate is minimized. It is thus possible to manufacture an electronic component including a piezoelectric thin film that exhibits excellent piezoelectric characteristics, in which the electromechanical coupling coefficient and the quality factor are increased.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 1A and 1B illustrate a piezoelectric thin-film resonator according to a preferred embodiment of the present invention, wherein

FIGS. 3A and 3B illustrate a first process of a manufacturing method for the piezoelectric thin-film resonator of this preferred embodiment of the present invention where

FIGS. 4A and 4B illustrate a second process of the manufacturing method for the piezoelectric thin-film resonator of this preferred embodiment of the present invention, where

FIGS. 5A and 5B illustrate a third process of the manufacturing method for the piezoelectric thin-film resonator of this preferred embodiment of the present invention, where

FIGS. 6A and 6B illustrate a fourth process of the manufacturing method for the piezoelectric thin-film resonator of this preferred embodiment of the present invention, where

DETAILED DESCRIPTION OF PREFERRED EMBODIMENTS

Figure 1A:
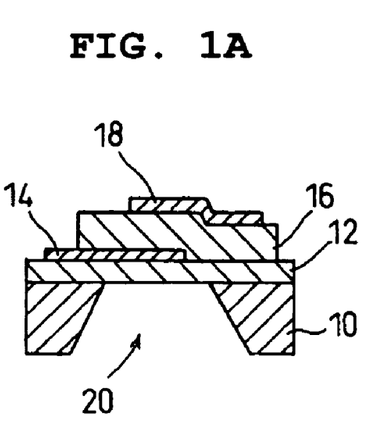
FIG. 1A is a sectional view taken along line (1)-(1) of FIG. 1B.
Figure 1B:
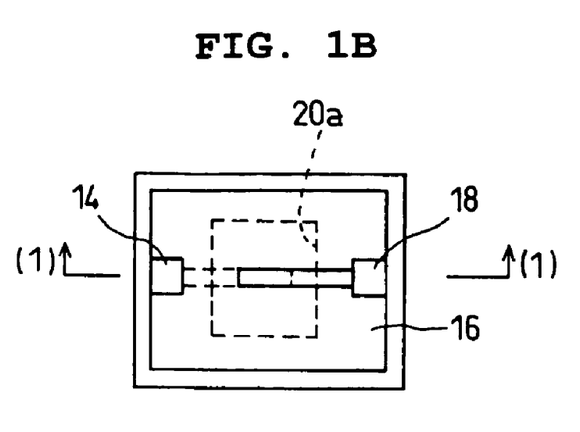
FIG. 1B is a plan view of the piezoelectric thin-film resonator.

The present invention is described in detail below with reference to the accompanying drawings through illustration of preferred embodiments. Preferred embodiments of the present invention are applicable to all types of electronic components provided with a piezoelectric film, such as a surface acoustic wave (SAW) filter and a duplexer. Preferred embodiments are described below in the context of a piezoelectric thin-film resonator as an example of the electronic components. Although this piezoelectric thin-film resonator preferably uses the thickness-extensional-vibration n-order mode, the present invention is applicable to other types of vibration modes, such as a thickness-shear-vibration n-order mode. The sectional views of the piezoelectric thin-film resonator constructed in accordance with this preferred embodiment of the present invention are shown in FIGS. 1A and 1B. FIG. 1A is a side sectional view of the piezoelectric thin-film resonator, and FIG. 1B is a plan view illustrating the piezoelectric thin-film resonator. FIG. 1A is a cross sectional view taken along line (1)-(1) of FIG. 1B. The piezoelectric thin-film resonator shown in FIGS. 1A and 1B preferably includes a substrate 10, a thin-film support portion 12, a lower electrode 14, a piezoelectric thin film 16, and an upper electrode 18. The substrate 10 has a cavity 20. Accordingly, by the provision of this cavity 20, the substrate 10 has an opening or a recessed portion. The thin-film support portion 12 is provided as an insulating thin film such that it covers the opening formed by the cavity 20. The piezoelectric thin film 16 is disposed on the thin-film support portion 12 such that it is sandwiched between the lower electrode 14 and the upper electrode 18, which define a laminated body. A portion of the lower electrode 14 and a portion of the upper electrode 18 are used as excitation electrodes such that they oppose each other across the piezoelectric thin film 16. As the materials of the piezoelectric thin-film resonator configured as described above, the substrate 10 is preferably formed of Si, the thin-film support portion 12 is preferably formed of $SiO_2$, and the piezoelectric thin film 16 is preferably essentially formed of ZnO. The signs of the temperature coefficients of the elastic constants are opposite between $SiO_2$ and ZnO. Accordingly, by setting the ratio of the thickness of $SiO_2$ and that of ZnO to a suitable value, the temperature coefficient of the resonant frequency in the fundamental mode can be decreased, and the temperature characteristics of the resonant frequency can be stabilized. In this case, the temperature coefficient of $SiO_2$ is preferably about +100 ppm/° C., and that of ZnO is preferably about −70 ppm/° C. The materials of the thin-film support portion 12 and the piezoelectric thin film 16 are not restricted to $SiO_2$ and ZnO, respectively, as long as the above-described temperature coefficient can be achieved. For example, the piezoelectric thin film 16 may be essentially formed of AlN or other components. The material of the substrate 10 is not restricted to Si, and may be another material, such as a liquid crystal or glass. The lower electrode 14 and the upper electrode 18 may be formed of any conductive metal, but more preferably, Al, Au, Pt, Nb, Mo, Ta, W, Ni, Cu, or Ag.

In this preferred embodiment, since the piezoelectric thin film 16 is formed by applying a predetermined bias potential, the lower electrode 14 does not become electrically floating. Accordingly, the piezoelectric thin-film resonator exhibits excellent electromechanical coupling coefficient ($k^2$) and quality factor (Q) than a known piezoelectric thin-film resonator in which the provision of a piezoelectric thin film causes a lower electrode to become electrically floating.

In the piezoelectric thin-film resonator of this preferred embodiment, the substrate 10 is formed of Si, and the cavity 20 is formed by a certain etching technique, for example, anisotropic etching or reactive ion etching. The thin-film support portion 12 is preferably formed of SiO$_2$, and the piezoelectric thin film 16 is preferably formed of ZnO. The lower electrode 14 and the upper electrode 18 are preferably formed by a certain film-forming technique, such as liftoff deposition. The piezoelectric thin film 16 is formed by a certain film-forming technique, such as reactive sputtering, by applying a bias potential of about +50 V to about +300 V to the lower electrode 14. The present invention is not limited to these film-forming techniques, and any technique may be used to form the piezoelectric thin film 16 as long as particles of the film 16 become ionized while a bias potential is applied to the lower electrode 14. Such film-forming techniques include, not only reactive sputtering, but also plasma CVD, RF sputtering, DC sputtering, and ECR sputtering, and other suitable methods.

Figure 2A:
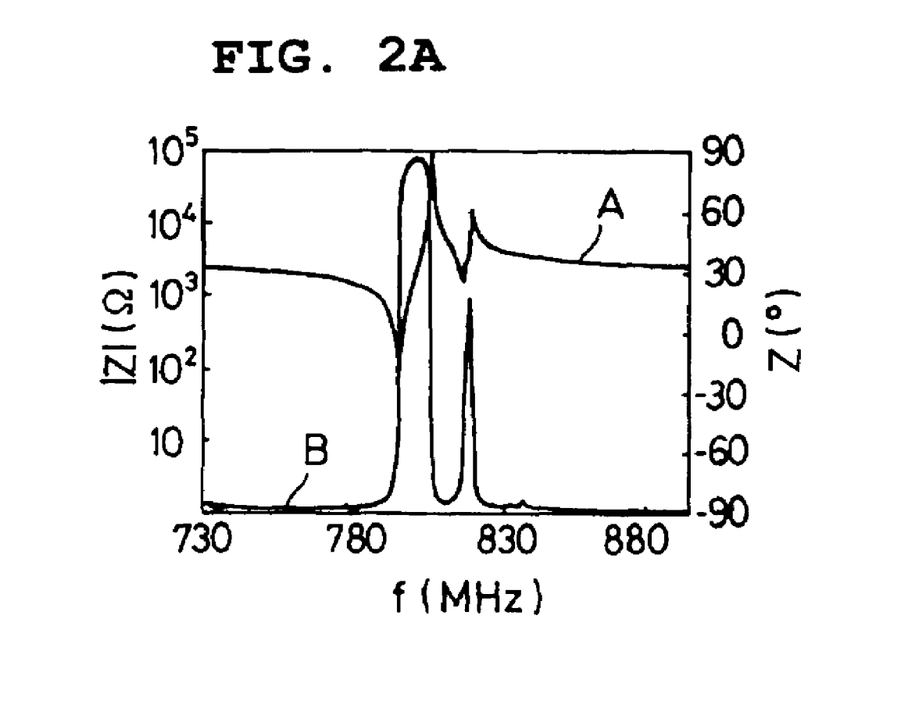
FIG. 2A illustrates an impedance characteristic and a phase characteristic of the piezoelectric thin-film resonator of this preferred embodiment of the present invention.
Figure 2B:
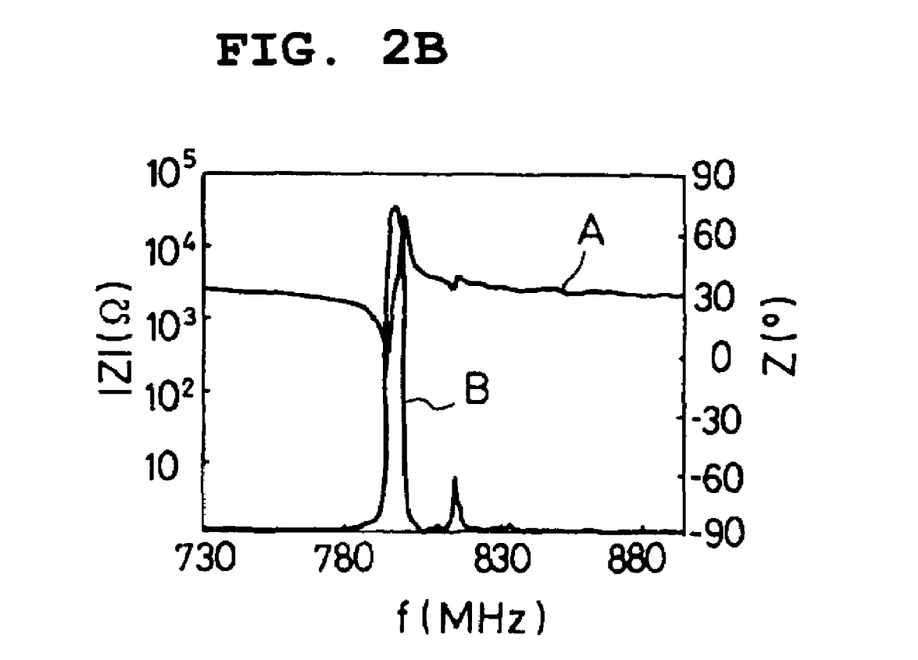
FIG. 2B illustrates an impedance characteristic and a phase characteristic of a known piezoelectric thin-film resonator.

For comparison, the impedance characteristic and the phase characteristic of the above-configured piezoelectric thin-film resonator of this preferred embodiment are shown in FIG. 2A, and the impedance characteristic and the phase characteristic of a known piezoelectric thin-film resonator are shown in FIG. 2B. In FIGS. 2A and 2B, the horizontal axis represents the frequency f (Hz), and the vertical axis on the left side indicates the impedance |Z|(Ω), and the vertical axis on the right side indicates the phase Z(°). A and B in FIGS. 2A and 2B indicate the impedance characteristic plotting and the phase characteristic plotting, respectively. The impedance characteristic and the phase characteristic shown in FIG. 2A were measured when the piezoelectric thin film 16 was formed while a bias potential of about +90 V was applied to the electrode. The impedance characteristic and the phase characteristic shown in FIG. 2B were measured when a piezoelectric thin film was formed without applying a bias potential. The surface roughness (Ra) of the piezoelectric thin film 16 of this embodiment is about 5.7 nm, and the gradient of the C axis of the piezoelectric thin film 16 with respect to the normal of the substrate is about 0.2° or smaller. FIG. 2A shows that the resonator using the piezoelectric thin film 16 exhibits the following characteristics: the maximum phase angle is about 86°; the resonance resistance is about 70Ω; the quality factor is about 1300; and the electromechanical coupling coefficient of the main vibration is about 2.6%. In contrast, the surface roughness (Ra) of the piezoelectric thin film of the known piezoelectric thin-film resonator is about 10.3 nm, and the gradient of the C axis of the piezoelectric thin film with respect to the normal of the substrate is about 1° or greater. FIG. 2B shows that the resonator using this piezoelectric thin film exhibits the following characteristics: the maximum phase angle is about 73°; the resonance resistance is about 210Ω; the quality factor is about 800; and the electromechanical coupling coefficient of the main vibration is about 1.5%.

In this embodiment, the surface roughness (Ra) is about 5.7 nm, and this is not a limitation for the present invention. According to the experiments carried out by the present inventor, sufficient characteristics were not obtained if the surface roughness (Ra) of the piezoelectric thin film was about 10.3 nm, and thus, the surface roughness (Ra) must be about 10 nm or smaller to obtain sufficient characteristics.

As discussed above, it is seen that the piezoelectric thin-film resonator of this preferred embodiment exhibits more excellent resonance characteristics than the known piezoelectric thin-film resonator. FIG. 2A is an example only, and by applying a positive bias potential to the lower electrode 14 within a range from about +50 V to about +300 V, the electromechanical coupling coefficient of the piezoelectric resonator results in a range from about 2.6% to about 9%, and the quality factor results in a range from about 200 to about 2000. Within the above-described range of a positive bias applied to the lower electrode 14, the piezoelectric thin-film resonator of preferred embodiments of the present invention exhibits more excellent resonance characteristics than a known piezoelectric thin-film resonator.

By applying a positive bias potential, the C-axis orientation of ZnO becomes higher. If the bias potential exceeds about +300 V, a tensile stress is generated in the piezoelectric thin film 16, which may lead to a burst of the piezoelectric thin film 16. A bias potential of lower than about +50 V is insufficient, producing the piezoelectric thin film having a surface roughness (Ra) of about 9 nm to about 10 nm. On the other hand, with the application of a bias potential in a range from about +90 V to about +200 V, stable and excellent resonance characteristics are obtained. Accordingly, in order to obtain stable resonance characteristics and to prevent a film burst, the positive bias potential to be applied is, as stated above, preferably from about +50 V to about +300 V, and more preferably, from about +90 V to about +200 V.

A manufacturing method for the piezoelectric thin-film resonator shown in FIGS. 1A and 1B is described below with reference to FIG. 3A through FIG. 6B.

Figure 3A:
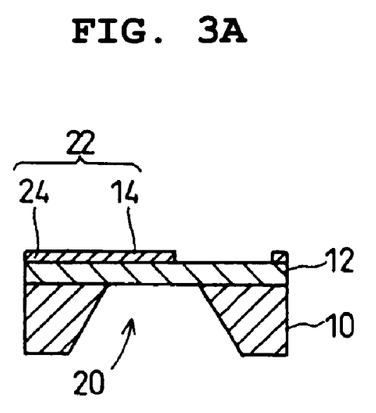
FIG. 3A is a sectional view taken along line (3)-(3) of FIG. 3B.
Figure 3B:
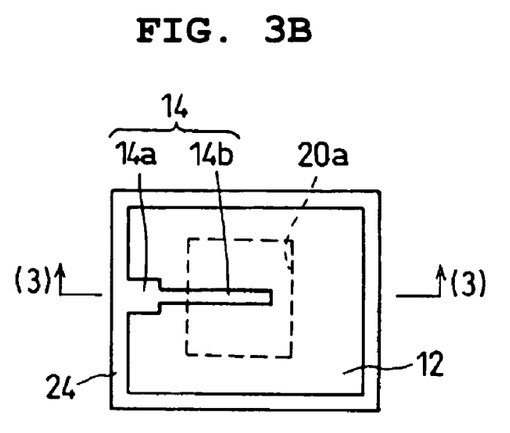
FIG. 3B is a plan view of the piezoelectric thin-film resonator to be manufactured.

A first process of the manufacturing method is discussed below with reference to FIGS. 3A and 3B. FIG. 3A is a side sectional view of the piezoelectric thin-film resonator to be manufactured, and FIG. 3B is a plan view thereof. FIG. 3A is a sectional view taken along line (3)-(3) of FIG. 3B.

In the first process, the Si substrate 10 formed into the shape of a substantially planar square when viewed from above and having a predetermined thickness is prepared. The surface of the substrate 10 is thermally oxidized to form the thin-film support portion 12, which is a SiO$_2$ insulating thin film. In this case, the thin-film support portion 12 may be deposited on the surface of the substrate 10 by sputtering CVD. The cavity 20 having the shape of a trapezoid when viewed from the side is formed from the lower surface of the substrate 10. The outer lines of the cavity 20 on the upper surface of the substrate 10 are indicated by 20a. The cavity 20 may be formed by a known technique, and the present invention is not restricted to any of such known techniques. If an etching technique is used for forming the cavity 20, either wet etching or dry etching can be used. Dry etching includes plasma, ion beam, and ion milling, and by combining plasma etching and sputtering (reactive sputter etching or reactive ion etching), anisotropic etching can be performed. As the etching mode, anisotropic etching is preferable.

Subsequently, an electrode unit 22 is formed on the thin-film support portion 12 by using Al, Au, Pt, Nb, Mo, Ta, W, Ni, Cu, or Ag as the material for liftoff deposition, for example. The electrode unit 22 is formed of the lower electrode 14 and a peripheral dummy electrode 24. The lower electrode 14 includes an input/output electrode 14a which generally has the shape of a square when viewed from above and which is located at an approximately central portion of the left edge of the thin-film support portion 12, and a lead-out electrode 14b extending from the input/output electrode 14a to the right side of FIG. 3B and generally having the shape of a narrowed rectangle when viewed from the top. The right edge of the lead-out electrode 14b defines the lower excitation electrode portion. The dummy electrode 24 is disposed around the thin-film support portion 12 such that it surrounds the entire periphery of the lower electrode 14. The dummy electrode 24 is electrically connected to the input/output electrode 14a of the lower electrode 14.

Figure 4A:
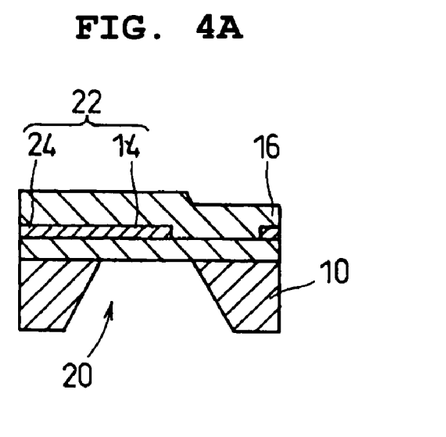
FIG. 4A is a sectional view taken along line (4)-(4) of FIG. 4B.
Figure 4B:
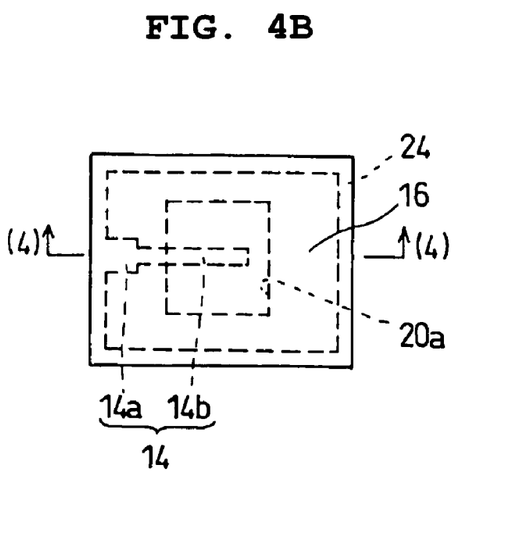
FIG. 4B is a plan view of the piezoelectric thin-film resonator to be manufactured.

A second process is discussed below with reference to FIGS. 4A and 4B. FIG. 4A is a side view of the piezoelectric thin-film resonator to be manufactured, and FIG. 4B is a plan view thereof. FIG. 4A is a sectional view taken along line (4)-(4) of FIG. 4B.

In the second process, the piezoelectric thin-film 16 mainly including ZnO is preferably formed by reactive sputtering. When forming the piezoelectric thin film 16, a bias potential of about +90 V is applied to the dummy electrode 24 by a potential applying device (not shown). By the application of a positive bias potential, the lower electrode 14 can be prevented from becoming electrically floating. The C axis of the piezoelectric thin film 16 has a high orientation with respect to the substrate 10, and is positively or negatively polarized in order, free from a mixture of the positive polarity and the negative polarity, which suffers from a known piezoelectric thin film.

According to a film-forming technique, such as reactive sputtering, plasma CVD, RF sputtering, DC sputtering, or ECR sputtering, that allows particles of a film to be ionized, it is not essential that a bias be applied during film formation. It is known, however, that the application of a bias results in a highly orientated film. If a bias is applied to the substrate 10 in the process of forming the piezoelectric thin film 16, the lower electrode 14 becomes electrically floating. That is, the piezoelectric thin film 16, which plays an important role in the piezoelectric resonator, cannot be formed on the lower electrode 14 while applying a bias. Then, by the provision of the dummy electrode 24, a bias can be applied to the lower electrode 14, resulting in the formation of the highly orientated piezoelectric film 16.

As a result, the surface roughness (Ra) of the piezoelectric thin film 16 is improved to about 5.7 nm over a known piezoelectric thin film (10 nm). The piezoelectric characteristics of the piezoelectric thin film 16 are also greatly improved: the electromechanical coupling coefficient is about 2.6%; and the quality factor is about 1300 in contrast to those of a known piezoelectric thin film (the electromechanical coupling coefficient is about 1.5% and the quality factor is about 800).

Figure 5A:
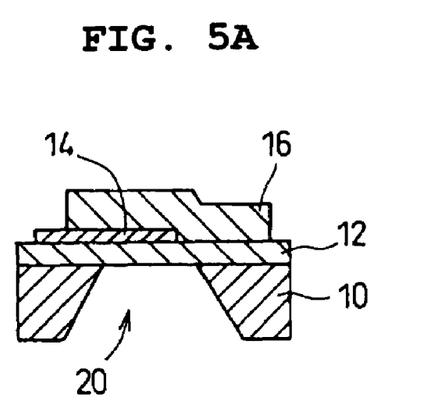
FIG. 5A is a sectional view taken along line (5)-(5) of FIG. 5B.
Figure 5B:
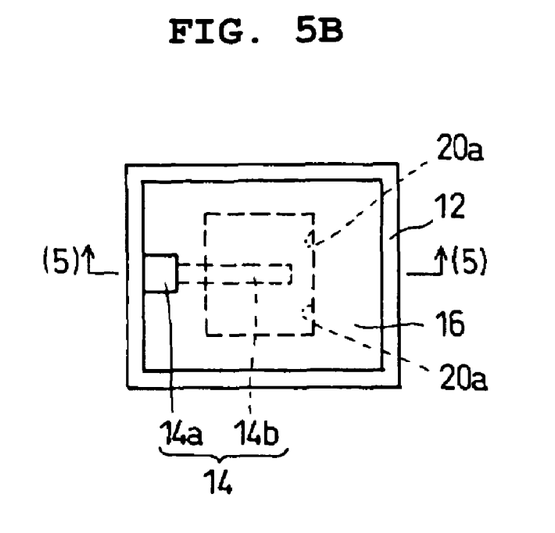
FIG. 5B is a plan view of the piezoelectric thin-film resonator to be manufactured.

A third process is discussed below with reference to FIGS. 5A and 5B. FIG. 5A is a side sectional view of the piezoelectric thin-film resonator to be manufactured, and FIG. 5B is a plan view thereof. FIG. 5A is a sectional view taken along line (5)-(5) of FIG. 5B.

In the third process, the outer periphery of the piezoelectric thin film 16 and the dummy electrode 24 are removed by reactive ion etching or wet etching, and also, the input/output electrode 14a of the lower electrode 14 is exposed.

Figure 6A:
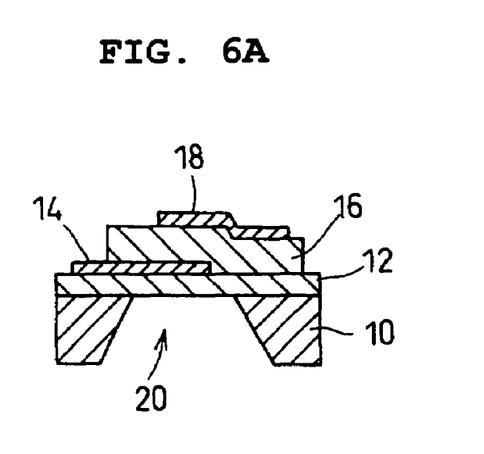
FIG. 6A is a sectional view taken along line (6)-(6) of FIG. 6B.
Figure 6B:
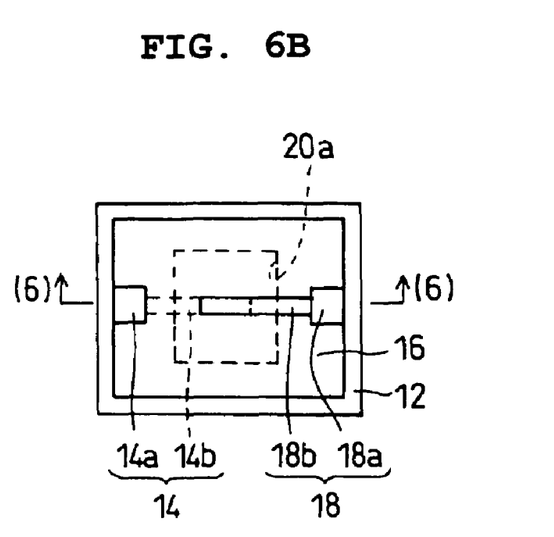
FIG. 6B is a plan view of the piezoelectric thin-film resonator to be manufactured.

A fourth process is described below with reference to FIGS. 6A and 6B. FIG. 6A is a side view of the piezoelectric tin-film resonator to be manufactured, and FIG. 6B is a sectional view thereof. FIG. 6A is a sectional view taken along line (6)-(6) of FIG. 6B.

In the fourth process, the upper electrode 18 is formed by, for example, liftoff deposition. The upper electrode 18 includes an input/output electrode 18a which generally has the shape of a square when viewed from above and which is located at an approximately central portion of the right edge of the piezoelectric thin film 16, and a lead-out electrode 18b extending from the input/output electrode 18a to the left side of FIG. 6B and generally having the shape of a narrowed rectangle when viewed from above. The left edge of the lead-out electrode 18b defines the upper excitation electrode.

The piezoelectric thin-film resonator of this preferred embodiment shown in FIGS. 1A and 1B can be manufactured, as described above.

Figure 7A:
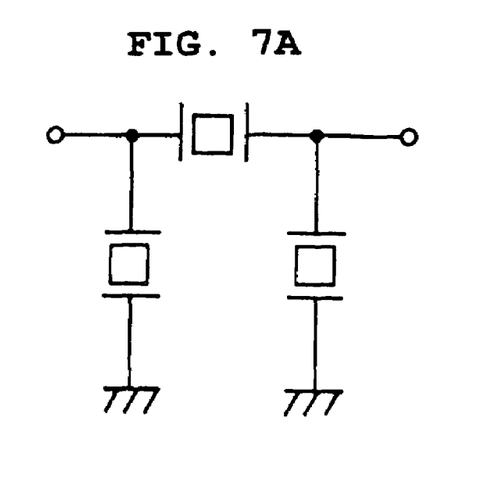
FIGS. 7A, 7B, and 7C are circuit diagrams of filters including the piezoelectric thin-film resonator of this preferred embodiment of the present invention.
Figure 7B:
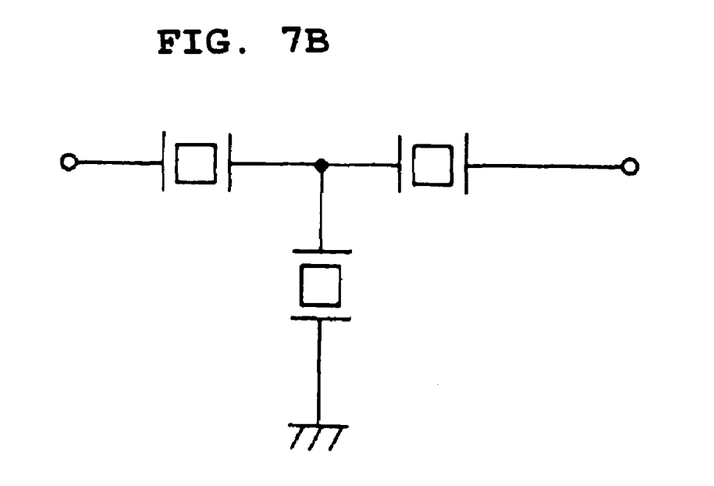
Figure 7C:
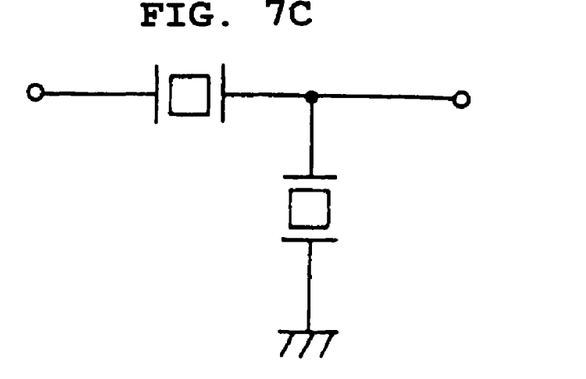

The piezoelectric thin-film resonator of this preferred embodiment can be integrated into a n-type ladder filter shown in FIG. 7A, a T-type filter shown in FIG. 7B, or an L-type filter shown in FIG. 7C. A filter integrating the piezoelectric thin-film resonator of this preferred embodiment exhibits stable filtering characteristics. To form such a filter having stable operating characteristics, a plurality of the above-described piezoelectric thin-film resonators are disposed on a substrate, and the electrodes of the resonators are connected to the wiring arrangement shown in FIG. 7A, 7B, or 7C.

Figure 8:
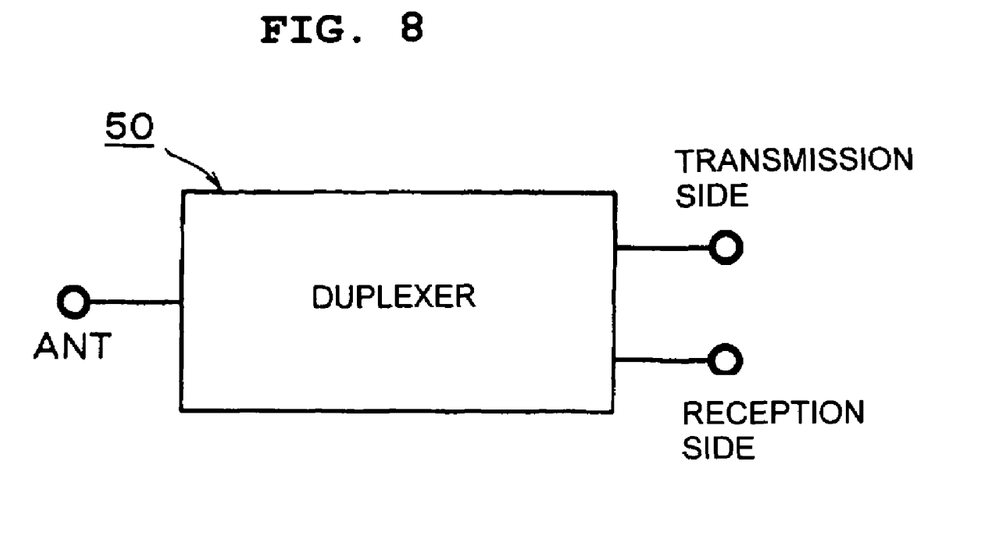
FIG. 8 is a circuit diagram of a duplexer including the piezoelectric thin-film resonator of this preferred embodiment of the present invention.

The piezoelectric thin-film resonator of this preferred embodiment can be included in a duplexer 50 for switching an antenna input/output ANT between the transmission side and the reception side, such as that shown in FIG. 8.

The piezoelectric thin-film resonator of this preferred embodiment or the filter shown in FIG. 7A, 7B, or 7C can be included in cellular telephones, wireless LANs, and other electronic communication apparatuses, thereby enabling the electronic communication operation of such electronic communication apparatus to be stable.

Figure 9:
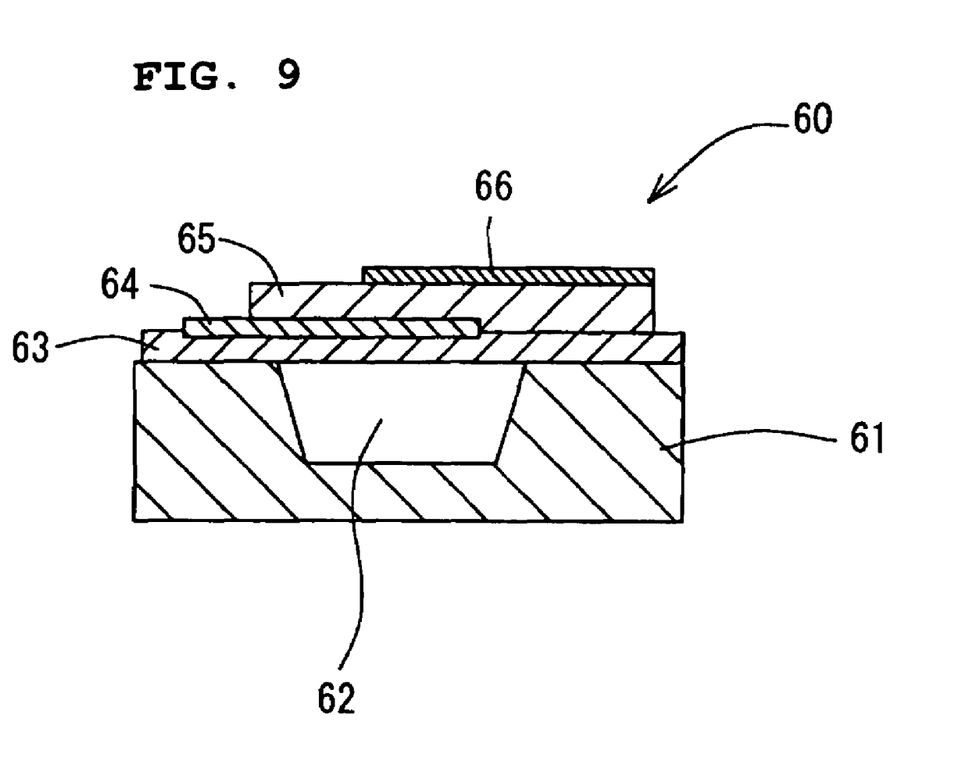
FIG. 9 is a side sectional view illustrating a modification made to the piezoelectric thin-film resonator of preferred embodiments of the present invention.

As a modification to the electronic component of preferred embodiments of the present invention, a piezoelectric thin-film resonator 60 is shown in FIG. 9. A recessed portion 62 having a desired shape may be formed on the top surface of a substrate 61, and a thin-film support portion 63, a lower electrode 64, a piezoelectric thin film 65, and an upper electrode 66 may sequentially be formed on the recessed portion 62. In this case, the recessed portion 62 has a bottom rather than vertically passing through the substrate 61, and the recessed portion 62 is covered by the thin-film support portion 63 so as to form a cavity.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A method for manufacturing an electronic component, comprising the steps of:
    forming a dummy electrode and a lower electrode on a substrate such that the dummy electrode is electrically connected to the lower electrode;
    forming a piezoelectric thin film on the lower electrode and the dummy electrode while a predetermined bias potential is applied to the lower electrode and the dummy electrode;
    removing the dummy electrode together with a peripheral portion of the piezoelectric thin film; and
    forming an upper electrode on the piezoelectric thin film such that a portion of the upper electrode and a portion of the lower electrode define a pair of vertically opposing excitation electrodes with the piezoelectric thin film therebetween.

2. A method for manufacturing an electronic component according to claim 1, wherein the bias potential ranges from about +50 V to about +300 V.

3. A method for manufacturing an electronic component according to claim 1, wherein the piezoelectric thin film includes one element selected from the group consisting of ZnO and AlN.

4. A method for manufacturing an electronic component according to claim 1, wherein the piezoelectric thin film is formed by using one of ion and plasma.

5. A method for manufacturing an electronic component according to claim 1, wherein the piezoelectric thin film is formed by one of a chemical vapor deposition method and a sputtering method.

6. A method of manufacturing an electronic component according to claim 1, wherein the dummy electrode is formed so as to surround a periphery of the lower electrode.

7. A method of manufacturing an electronic component according to claim 1, wherein the dummy electrode and the lower electrode are formed at the same time.

8. A method of manufacturing an electronic component according to claim 1, wherein the step of forming the dummy electrode and the lower electrode includes separate steps of forming the dummy electrode and forming the lower electrode.

9. A method of manufacturing an electronic component according to claim 1, further comprising the step of forming an insulating thin film on the substrate before the step of forming the dummy electrode and the lower electrode.

* * * * *